(12) United States Patent
Chen

(10) Patent No.: US 8,044,729 B2
(45) Date of Patent: Oct. 25, 2011

(54) PHASE LOCKED LOOP AND VOLTAGE CONTROLLED OSCILLATOR THEREOF

(75) Inventor: Wei-Yung Chen, Hsinchu County (TW)

(73) Assignee: Phison Electronics Corp., Miaoli (TW)

( * ) Notice: Subject to any disclaimer, the term of this patent is extended or adjusted under 35 U.S.C. 154(b) by 104 days.

(21) Appl. No.: 12/612,890

(22) Filed: Nov. 5, 2009

(65) Prior Publication Data

US 2011/0084743 A1 Apr. 14, 2011

(30) Foreign Application Priority Data

Oct. 9, 2009 (TW) ............................... 98134313 A

(51) Int. Cl.
*H03K 3/03* (2006.01)
*H03L 7/099* (2006.01)

(52) U.S. Cl. ...................... 331/57; 331/17; 331/36 C

(58) Field of Classification Search .................. 331/57, 331/17, 34, 36 V, 177 V, 177 R, 10, 11, 36 C, 331/77 V, 1; 327/156; 375/376
See application file for complete search history.

(56) References Cited

U.S. PATENT DOCUMENTS

| | | | | |
|---|---|---|---|---|
| 6,060,953 A * | 5/2000 | Tsai | ............................... | 331/11 |
| 6,462,623 B1 * | 10/2002 | Horan et al. | ..................... | 331/17 |
| 7,834,708 B1 * | 11/2010 | Ren | ................................. | 331/57 |

* cited by examiner

*Primary Examiner* — Ryan Johnson
(74) *Attorney, Agent, or Firm* — J.C. Patents

(57) ABSTRACT

A phase locked loop (PLL) and a voltage controlled oscillator (VCO) thereof are provided. The VCO includes a ring oscillator circuit and a control circuit. The ring oscillator circuit is used for providing an output clock signal; and the control circuit is coupled to the ring oscillator circuit, and used for receiving an output voltage to respectively provide a first voltage-frequency gain and a second voltage-frequency gain so as to control a frequency of the output clock signal provided by the ring oscillator circuit, wherein the first voltage-frequency gain is larger than the second voltage-frequency gain.

17 Claims, 6 Drawing Sheets

PHASE LOCKED LOOP AND VOLTAGE CONTROLLED OSCILLATOR THEREOF

CROSS-REFERENCE TO RELATED APPLICATION

This application claims the priority benefit of Taiwan application serial no. 98134313, filed on Oct. 9, 2009. The entirety of the above-mentioned patent application is hereby incorporated by reference herein and made a part of this specification.

BACKGROUND

1. Field of the Invention

The present invention relates to a phase locked loop (PLL), more particularly, to a PLL with a low-variation and stable loop bandwidth.

2. Description of the Related Art

Phase locked loop (PLL) plays important roles in the communication engineering area, and its application range is quite extensive, for example, modulation, de-modulation, frequency multiplication, frequency synthesizing, carrier synchronization, bit synchronization, etc. all apply the concept and technical of PLL therein. PLL is a kind of feedback loop. In the loop, the frequency and phase of the output clock signal are locked on the same frequency and phase of the input reference clock signal by using the feedback signal. Therefore, in the radio communications, if the phenomenon of carrier frequency offset is occurred by signal transmitting, the local oscillation frequency of the receiver follows the frequency offset to achieve the purpose of phase locking by using PLL in the receiver.

FIG. 1 is a diagram of a conventional PLL 100. Referring to FIG. 1, in general, the PLL 100 includes a phase detector (PD) 101, a charge pump (CP) 103, a loop filter (LF) 105, and a voltage controlled oscillator (VCO) 107. The PD 101 would compare the phase of the input reference clock signal Ref_Clk with the phase of the output clock signal Out_Clk returned from the VCO 107, so as to generate a control signal CS to the CP 103.

The CP 103 generates an output voltage Vout according to the control signal CS. The LF 105 is composed by the resistor Rf and the capacitor Cf, and used for filtering high frequency noises on the output voltage Vout of the CP 103. The VCO 107 generates the output clock signal Out_Clk in response to the output voltage Vout, which is filtered by the LF 105, of the CP 103.

For some PLL's applications, the loop bandwidth of the PLL is requested for having very low variation, and the loop transfer function of the conventional PLL is generally determined by the gain (Kpd) of the PD 101, the current (Icp) of the CP 103, the gain (Kvco) of the VCO 107, the resistor Rf, and the capacitor Cf.

In practical, since the PD 101 may be composed by a pure digital circuit, so that the range of variation of the gain (Kpd) of the PD 101 is very low. Accordingly, the variation of the gain (Kpd) of the PD 101 has a little effect on the loop bandwidth of the PLL 100. In addition, the capacitor Cf also has a little effect on the loop bandwidth of the PLL 100, and if the current (Icp) of the CP 103 is the inverse of the resistor Rf, the current (Icp) of the CP 103 also has a little effect on the loop bandwidth of the PLL 100. Furthermore, the gain (Kvco) of the VCO 107 has a biggest effect and a hardest control on the loop bandwidth of the PLL 100. The gain (Kvco) of the VCO 107 is defined as below:

$$Kvco = \frac{\Delta f}{\Delta v}$$

Wherein, $\Delta f$ is the differential of the frequency of the output clock signal of the VCO 107 in a unit time; and $\Delta V$ is the differential of the output voltage of the CP 103 in a unit time.

In general, in order to restrain the variation of the gain (Kvco) of the VCO 107 so as to no influence the variation of the loop bandwidth of the PLL 100. The structure of inductor-capacitor (LC) may be mostly used to make the VCO (i.e. LC VCO), but since the LC VCO has an up limit to restrain the variation of the gain (Kvco) of the VCO 107, and needs more layout area and higher fabrication cost, so that the die designer would not like to design such VCO into the die.

In addition, if by using low cost process, the structure of ring oscillator circuit may be usually used to make the VCO (ring oscillator VCO), but since the variation of the gain (Kvco) of the ring oscillator VCO is quite high when the temperature, voltage, and process are changed. Accordingly, the loop bandwidth of the PLL 100 also has a high variation and unstable.

Nothing herein should be construed as an admission of knowledge in the prior art of any portion of the present invention. Furthermore, citation or identification of any document in this application is not an admission that such document is available as prior art to the present invention, or that any reference fauns a part of the common general knowledge in the art.

SUMMARY

The present invention is directed to a voltage controlled oscillator (VCO), which is composed by a ring oscillator circuit, and the variation of the gain (Kvco) of the present VCO is quite low when the temperature, voltage, and process are changed, such that the loop bandwidth of the phase locked loop (PLL) also has a lower variation and is stable.

In order to achieve one, a portion of, all objectives or other objectives, an embodiment of the present invention provides a voltage controlled oscillator (VCO) including a ring oscillator circuit and a control circuit. The ring oscillator circuit is used for providing an output clock signal. The control circuit is coupled to the ring oscillator circuit, and used for receiving an output voltage to respectively provide a first voltage-frequency gain and a second voltage-frequency gain so as to control a frequency of the output clock signal provided by the ring oscillator circuit, wherein the first voltage-frequency gain is larger than the second voltage-frequency gain.

Another embodiment of the present invention provides a phase locked loop (PLL) at least including a phase detector, a charge pump, a loop filter, and the VCO provided by the present invention.

The variation of the gain (Kvco) of the VCO, provided by the present invention and applied in the PLL, is mainly determined by the second voltage-frequency gain which has a lower variation and may be fixed in ideal. Accordingly, even though the VCO is composed by the ring oscillator circuit which is highly influenced by temperature, voltage, and process changing, the variation of the gain (Kvco) is quite low, such that the loop bandwidth of the PLL also has a lower variation and is stable. In addition, since the VCO is composed by the ring oscillator circuit, so that not only the VCO may be used in the low cost process, but also the VCO may have at least some of the advantages as that simple circuit structure, low fabrication cost, and small layout area. Accordingly, the die designer would like to design such VCO into the die.

It should be understood, however, that this Summary may not contain all of the aspects and embodiments of the present invention, is not meant to be limiting or restrictive in any manner, and that the invention as disclosed herein is and will be understood by those of ordinary skill in the art to encompass obvious improvements and modifications thereto.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
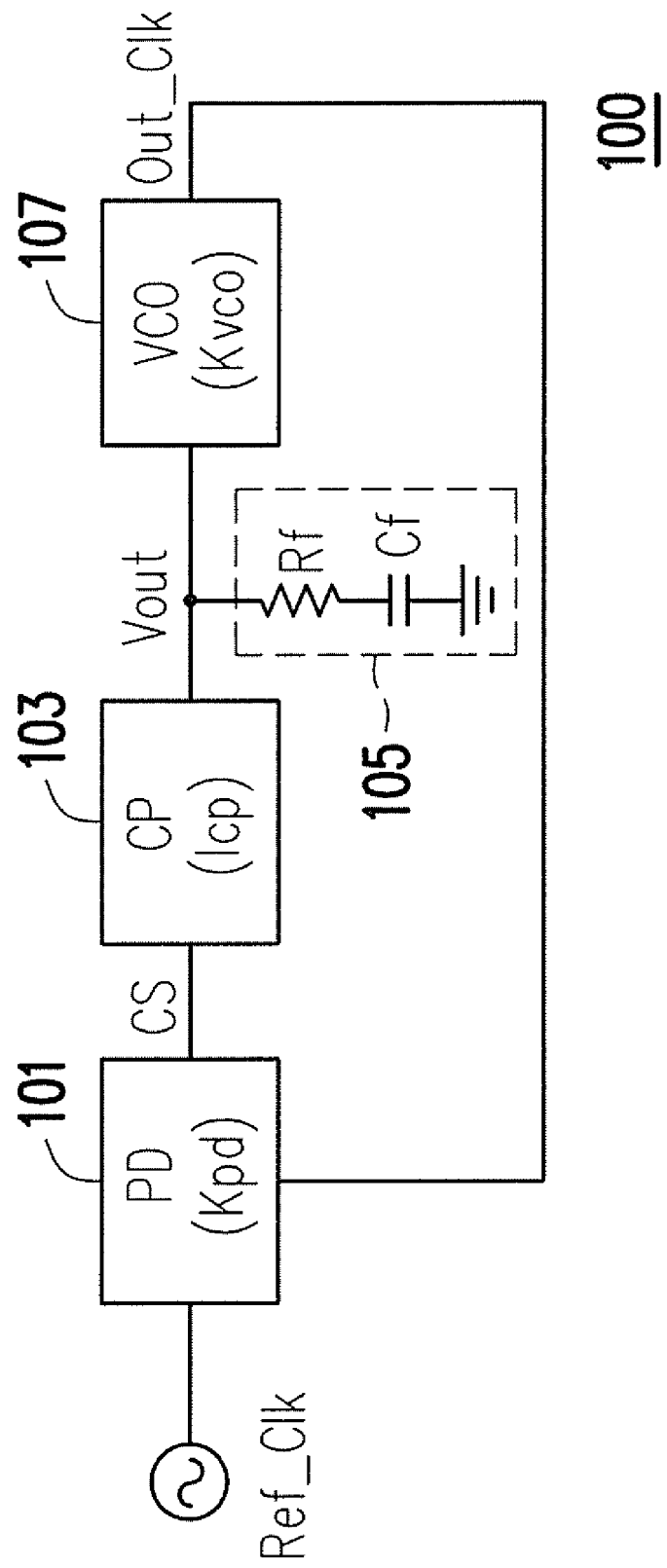
FIG. 1 is a diagram of a conventional phase locked loop (PLL).

Reference will now be made in detail to the present preferred embodiments of the invention, examples of which are illustrated in the accompanying drawings. Wherever possible, the same reference numbers are used in the drawings and the description to refer to the same or like parts.

Embodiments of the present invention may comprise any one or more of the novel features described herein, including in the Detailed Description, and/or shown in the drawings. As used herein, "at least one", "one or more", and "and/or" are open-ended expressions that are both conjunctive and disjunctive in operation. For example, each of the expressions "at least on of A, B and C", "at least one of A, B, or C", "one or more of A, B, and C", "one or more of A, B, or C" and "A, B, and/or C" means A alone, B alone, C alone, A and B together, A and C together, B and C together, or A, B and C together.

It is to be noted that the term "a" or "an" entity refers to one or more of that entity. As such, the terms "a" (or "an"), "one or more" and "at least one" can be used interchangeably herein. In addition, in the exemplary embodiments below, when a device is described as being "connected" or "coupled" to another device, the device can be directly connected or coupled to another device, or other devices can be arranged therebetween.

Figure 2:
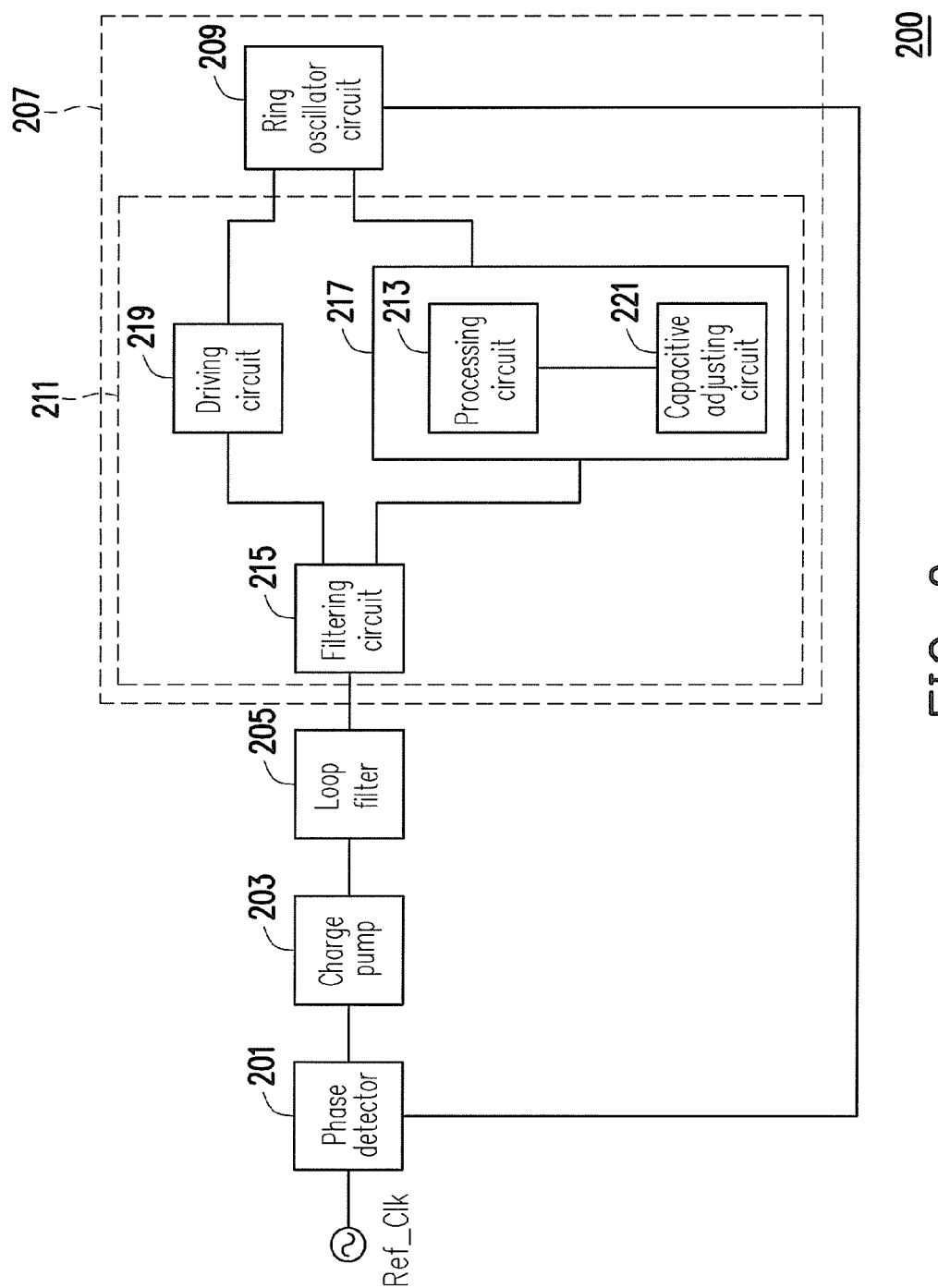
FIG. 2 is a block diagram of a PLL according to an exemplary embodiment of the present invention.
Figure 3:
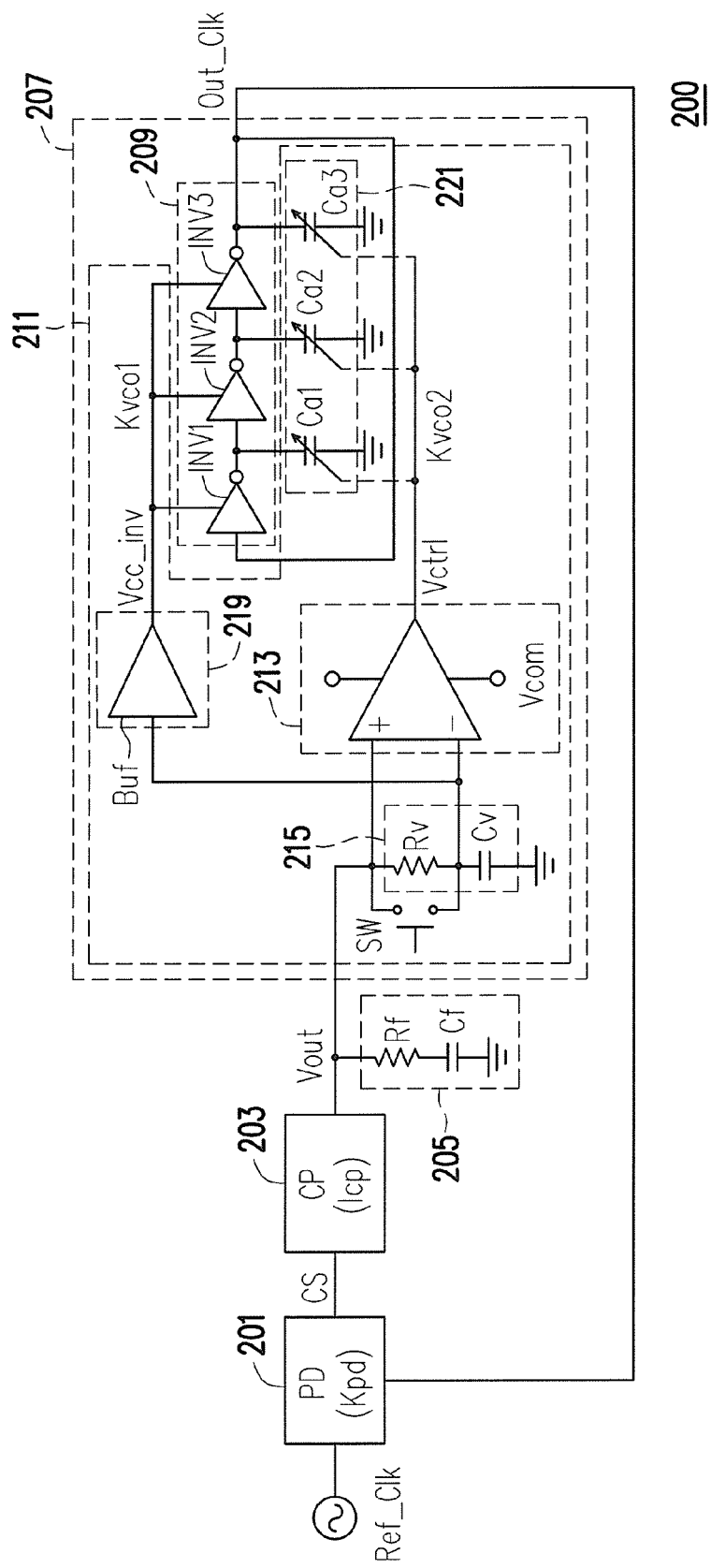
FIG. 3 is a circuit diagram of a PLL according to an exemplary embodiment of the present invention.

FIGS. 2 and 3 are respectively a block diagram and a circuit diagram of a PLL 200 according to an exemplary embodiment of the present invention. Referring to FIGS. 2 and 3, the PLL 200 includes a phase detector (PD) 201, a charge pump (CP) 203, a loop filter (LF) 205, and a voltage controlled oscillator (VCO) 207. The PD 201 is used for comparing a phase of an input reference clock signal Ref_Clk with a phase of an output clock signal Out_Clk returned from the VCO 207 so as to accordingly output a control signal CS to the CP 203. The CP 203 is coupled to the PD 201, and used for generating an output voltage Vout in response to the control signal CS, for example, the output voltage Vout is generated by a boost or a buck function.

The LF 205 is generally a low pass filter (LPF) composed by a resistor Rf and a capacitor Cf, and used for filtering high frequency noises on the output voltage Vout provided by the CP 203. In the exemplary embodiment, the LF 205 may also be a single-capacitor filter, a single-stage or a multi-stage filter, but all not limited thereto. A first terminal of the resistor Rf is used for receiving the output voltage Vout provided by the CP 203. A first terminal of the capacitor Cf is coupled to a second terminal of the resistor Rf, and a second terminal of the capacitor Cf is coupled to a reference voltage level (for example, a ground potential, but not limited thereto).

The VCO 207 includes a ring oscillator circuit 209 and a control circuit 211. The ring oscillator circuit 207 is used for providing the output clock signal Out_Clk; and the control circuit 211 is coupled to the LF 205 and the ring oscillator circuit 209, and used for receiving the output voltage Vout on the LF 205 to respectively provide a first voltage-frequency gain and a second voltage-frequency gain so as to control the frequency of the output clock signal Out_Clk provided by the ring oscillator circuit 209, wherein the first voltage-frequency gain is larger than the second voltage-frequency gain. Herein, the detail description would be explained as below.

Based on the "Description of the Related Art", it can be known that the voltage-frequency gain (Kvco) of the VCO has a bigger effect on the loop bandwidth of the PLL. However, it is difficult to control. Moreover, if by using low cost process, since the variation of the voltage-frequency gain (Kvco) of the VCO, composed by the ring oscillator circuit, is quite high when the temperature, voltage, and process are changed. Therefore, the frequency drift of the output clock signal provided by the VCO would be caused when the circuit is operating in a bit of temperature or voltage changing, such that the loop bandwidth of the PLL also has a high variation and is unstable.

Accordingly, in the exemplary embodiment, the control circuit 211 is specifically added into the VCO 207 composed by the ring oscillator circuit 209, and the control circuit 211 provides at least two voltage-frequency gains so as to restrain the variation of the gain of the VCO 207, such that the loop bandwidth of the PLL 200 also has a lower variation and is more stable. In the exemplary embodiment, the control circuit 211 includes a filtering circuit 215, a dynamic loop frequency adjusting circuit 217 and a driving circuit 219. The filtering circuit 215 is coupled to the LF 205 and the ring oscillator circuit 209 through the dynamic loop frequency adjusting circuit 217 and the driving circuit 219, and used for receiving the output voltage Vout on the LF 205 so as to provide the first voltage-frequency gain. A terminal of the dynamic loop frequency adjusting circuit 217 is coupled to the ring oscillator circuit 209, and another terminal of the dynamic loop frequency adjusting circuit 217 is coupled to the filtering circuit 215. The dynamic loop frequency adjusting circuit 217 is used for providing the second voltage-frequency gain.

In the exemplary embodiment of the present invention, the dynamic loop frequency adjusting circuit 217 includes a processing circuit 213 and a capacitive adjusting circuit 221. A terminal of the processing circuit 213 is coupled to the capacitive adjusting circuit 221 for outputting a dynamic loop operating voltage Vctrl, and another terminal of the processing circuit 213 is coupled to the filtering circuit 215. The capacitive adjusting circuit 221 is respectively coupled to the processing circuit 213 and the ring oscillator circuit 209, and used for receiving the dynamic loop operating voltage Vctrl so as to change a capacitance thereof accordingly.

In another exemplary embodiment of the present invention, the VCO 207 further may include the driving circuit 219. Two terminals of the driving circuit 219 are respectively coupled to the ring oscillator circuit 209 and the filtering circuit 215, and the driving circuit 219 is used for driving the ring oscillator circuit 209.

In an exemplary embodiment of the present invention, the ring oscillator circuit 209 is composed by three inverters INV1 to INV3, but not limited thereto, namely, the ring oscillator circuit 209 may be composed by at least one inverter, or may be composed by resistors and capacitors (i.e. RC ring oscillator), or may be composed by a plurality of differential amplifiers. An input terminal of the inverter INV2 is coupled to an output terminal of the inverter INV1. An input terminal of the inverter INV3 is coupled to an output terminal of the inverter INV2, and an output terminal of the inverter INV3 is coupled to an input terminal of the inverter INV1.

The filtering circuit 215 is a single-stage filter, and includes a resistor Rv and a capacitor Cv. A first terminal of the resistor Rv is used for receiving the output voltage Vout on the LF 205, a first terminal of the capacitor Cv is coupled to a second terminal of the resistor Rv, and a second terminal of the capacitor Cv is coupled to the reference voltage level (for example, the ground potential, but not limited thereto). Herein, it should be noted that the filtering circuit 215 may also be single-capacitor filter, or a multi-stage filter, but all not limited thereto. In addition, the time constant of the filtering circuit 215 is larger than the time constant of the LF 205. For example, the time constant of the filtering circuit 215 is 10 times for the time constant of the LF 205, but not limited thereto.

Figure 4:
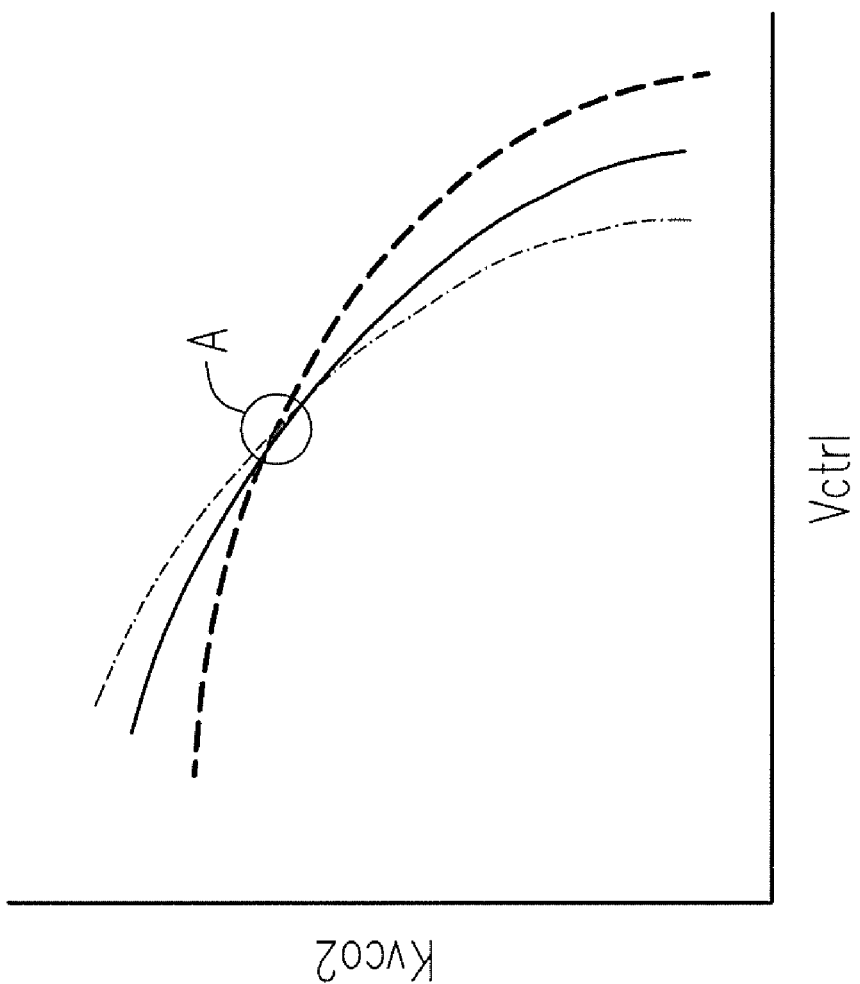
FIG. 4 is a curve diagram of a dynamic loop operating voltage (Vctrl) relative to a gain (Kvco2) when a PLL is simulated in different temperatures, voltages and processes according to an exemplary embodiment of the present invention.

The processing circuit 213 is used for receiving a voltage provided by the filtering circuit 215. In the exemplary embodiment, the processing circuit 213 is a differential amplifier, but not limited thereto. The differential amplifier is coupled to the resistor Rv of the filtering circuit 215 in parallel, namely, the non-inverted terminal (+) and the inverted terminal (−) of the differential amplifier are respectively coupled to the first and the second terminals of the resistor Rv. Accordingly, the processing circuit 213 outputs the dynamic loop operating voltage Vctrl in only response to the voltage drop on the resistor Rv. In the present exemplary embodiment, a compensation voltage Vcom is additionally added into the processing circuit 213 to reach an operating voltage point A as shown in FIG. 4, so as to co-operate with a plurality of varactors in the capacitive adjusting circuit 221 to correct the frequency of the output clock signal Out_Clk provided by the ring oscillator circuit 209.

The capacitive adjusting circuit 221 includes a first varactor Ca1, a second varactor Ca2 and a third varactor Ca3. A control terminal of the varactor Ca1 is used for receiving the dynamic loop operating voltage Vctrl, a first terminal of the varactor Ca1 is coupled to the output terminal of the inverter INV1, and a second terminal of the varactor Ca1 is coupled to the reference voltage level. Similarly, control terminals of the varactors Ca2 and Ca3 are respectively used for receiving the dynamic loop operating voltage Vctrl, first terminals of the varactors Ca2 and Ca3 are respectively coupled to the output terminals of the inverters INV2 and INV3, and second terminals of the varactors Ca2 and Ca3 are respectively coupled to the reference voltage level. It should be noted that the varactors Ca1 to Ca3 are not limited to configure in the control circuit 211 at the same time, namely, just only at least one of the varactors Ca1 to Ca3 may be configured in the control circuit 211; moreover, the number of the varactors in the control circuit 211 may be determined by the number of the inverters in the ring oscillator circuit 209, namely, the number of the varactors may co-operate with the number of the inverters.

The driving circuit 219 includes a buffer Buf. In the present exemplary embodiment, the buffer Buf may be an operational amplifier, but not limited thereto. An input terminal of the buffer Buf is coupled to the second terminal of the resistor Rv, and an output terminal of the buffer Buf is used for outputting a voltage to be served as an operation voltage Vcc_inv of the inverters INV1 to INV3.

In the present exemplary embodiment, the output clock signal Out_Clk relative to the operation voltage Vcc_inv has a first voltage-frequency gain. Herein, the first voltage-frequency gain is defined as Kvco1. The first voltage-frequency gain Kvco1 is a ratio of a variation of the frequency of the output clock signal Out_Clk provided by the ring oscillator circuit 209 to a variation of an output voltage of the driving circuit 219; and the first voltage-frequency gain Kvco1 may be represented by following formula:

$$Kvco1 = \frac{\Delta f}{\Delta V_{cc\_inv}}$$

Wherein, $\Delta f$ is the differential of the frequency of the output clock signal of the ring oscillator circuit 209 in a unit time; and $\Delta V_{cc\_inv}$ is the differential of the output voltage of the driving circuit 219 in a unit time.

In addition, the output clock signal Out_Clk relative to the dynamic loop operating voltage Vctrl has a second voltage-frequency gain. Herein, the second voltage-frequency gain is defined as Kvco2. The second voltage-frequency gain Kvco2 is a ratio of the frequency of the output clock signal Out_Clk provided by the ring oscillator circuit 209 to a variation of an output voltage of the processing circuit 213; and the second voltage-frequency gain Kvco2 may be represented by following formula:

$$Kvco2 = \frac{\Delta f}{\Delta V_{ctrl}}$$

Wherein, $\Delta f$ is the differential of the frequency of the output clock signal of the ring oscillator circuit 209 in a unit time; and $\Delta V_{ctrl}$ is the differential of the output voltage of the processing circuit 213 in a unit time.

In the present exemplary embodiment, the first voltage-frequency gain Kvco1 is larger than the second voltage-frequency gain Kvco2, for example, the first voltage-frequency gain Kvco1 is 10 times for the second voltage-frequency gain Kvco2, but not limited thereto. In addition, the product of the resistor Rv and the capacitor Cv is a time constant, and the inverse of this time constant represents a frequency (i.e. 1/(Rv*Cv)) which is smaller than the loop bandwidth BW of the PLL 200, for example, 1/(Rv*Cv)<BW/200, but not limited thereto.

Based on the above conditions, when a rate of the output voltage Vout, provided by CP 203 and received by the control circuit 211, variation is smaller than the time constant of the filtering circuit 215, and the second voltage-frequency gain Kvco2 has a larger impact on the frequency of the output clock signal Out_Clk provided by the ring oscillator circuit 209 than the first voltage-frequency gain Kvco1. However, in the present exemplary embodiment, the time constant of the filtering circuit 215 is the product of the resistor Rv and the capacitor Cv, but the present invention is not limited thereto, namely, the time constant of different filtering circuit has a specific calculation formula, but such knowledge would be understood by one person having ordinary skilled in the art, so the detail thereof would be omitted herein.

To be specific, it can be clearly seen that, in FIG. 3, in the present exemplary embodiment, the ring oscillator circuit 209 is controlled by the driving circuit 219 and the processing circuit 213. When the jitter of the output voltage Vout provided by the CP 203 is slower, the voltage (i.e. the operation voltage Vcc_inv of the inverters INV1 to INV3) outputted from the driving circuit 219 controls the variation of the frequency of the ring oscillator circuit 209. Even though the output clock signal Out_Clk relative to the operation voltage Vcc_inv has a larger gain Kvco1 variation, but it does not influence the short-term loop dynamic after filtering by the resistor Rv and the capacitor Cv. Moreover, since the reverse of the product of the resistor Rv and the capacitor Cv represents a frequency, which is substantially smaller than the loop bandwidth of the PLL 200 and may be determined by practical design requirements, such that the loop stability of the PLL 200 may not be influenced.

On the other hands, when the jitter of the output voltage Vout, provided by the CP 203 and received by the control circuit 211, is faster, the dynamic loop operating voltage Vctrl outputted by the processing circuit 213 has a larger effect on the frequency of the output clock signal Out_Clk provided by the ring oscillator circuit 209. And, at this time, the gain of the VCO 207 and the loop bandwidth of the PLL 200 are mainly determined by the second voltage-frequency gain Kvco2, so that the second voltage-frequency gain Kvco2 cannot be more changed. In other words, if the voltage value of the dynamic loop operating voltage Vctrl can be maintained, the variation of the second voltage-frequency gain Kvco2 can be reduced to a lower value.

In the present exemplary embodiment, the best operating point of the voltage value of the dynamic loop operating voltage Vctrl may be obtained by viewing a curve diagram of the dynamic loop operating voltage Vctrl relative to the gain Kvco2 when the PLL 200 is simulated in different temperatures, voltages and processes, such as shown in FIG. 4. It can be clearly seen that, in FIG. 4, the curve diagram of the dynamic loop operating voltage Vctrl relative to the gain Kvco2 has three curves, and the intersection A of these three curves represents that the gain Kvco2, represented by the output clock signal Out_Clk relative to the dynamic loop operating voltage Vctrl, has a lower variation. Therefore, if the voltage value of the dynamic loop operating voltage Vctrl outputted from the processing circuit 213 is set to the voltage value of the intersection A, the variation of the gain Kvco2 may be reduced to a lower value. Even though the gain Kvco2 still has a bit of changing, but such variation is substantially reduced a lot by comparing with the variation of the gain of the VCO in the conventional PLL, such that the loop bandwidth of the PLL 200 would have a lower variation and is more stable.

Figure 6:
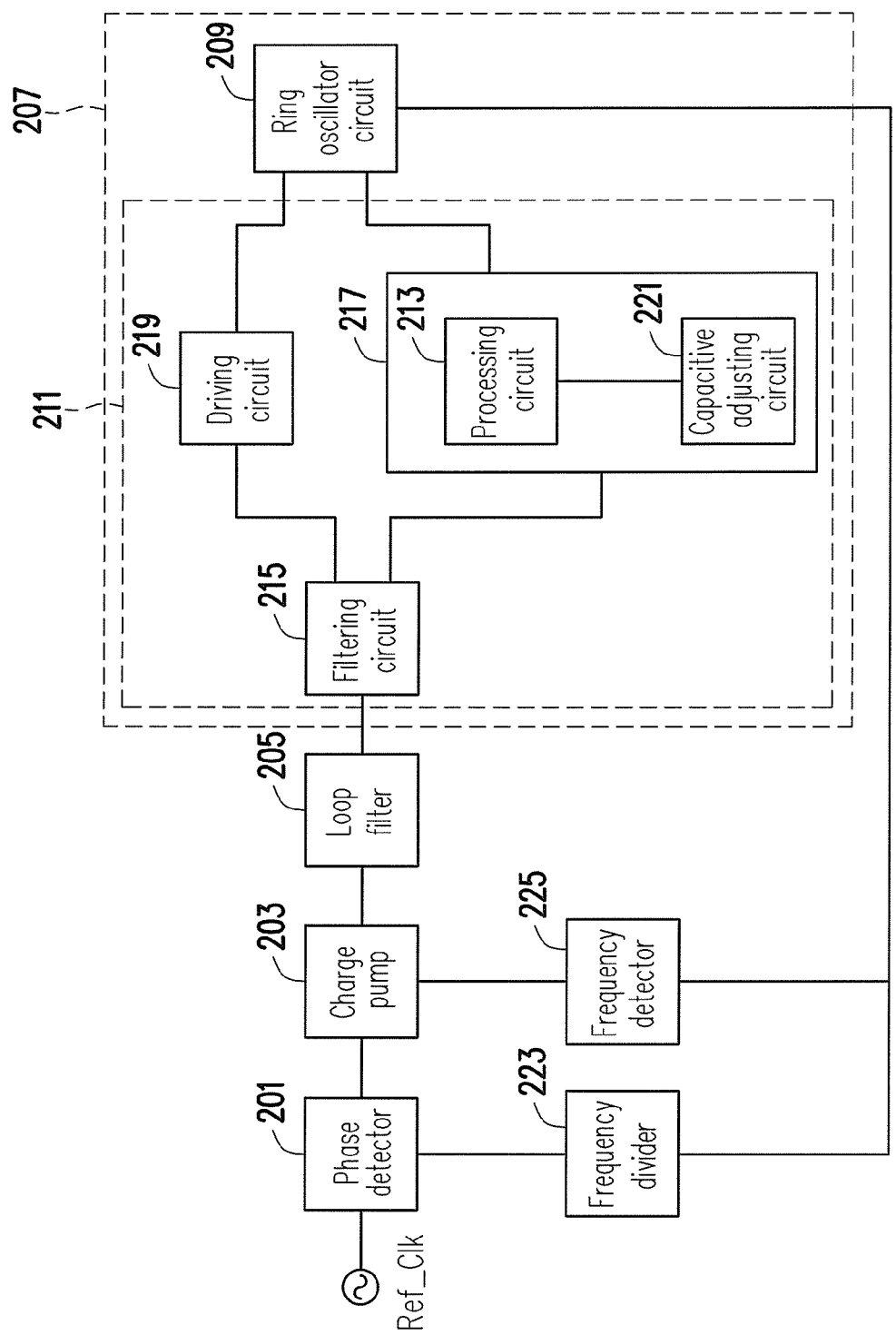
FIG. 6 is a block diagram of a PLL according to another exemplary embodiment of the present invention.

In addition, referring to FIG. 6, in another exemplary embodiment of the present invention, the PLL 200 may further include a frequency divider 223. Two terminals of the frequency divider 223 are respectively coupled to the ring oscillator circuit 209 and the PD 201, and used for downconverting the frequency of the output clock signal Out_Clk provided by the ring oscillator circuit 209 when a circuit needs to track a signal with very high frequency, but the PD 201 would not be operated in such high frequency. To be specific, a first terminal of the frequency divider 223 is coupled to the output terminal of the ring oscillator circuit 209, and a second terminal of the frequency divider 223 is coupled to the input terminal of the PD 201. The divisor of the frequency divider 223 may be determined by the abilities of the PD 201 and the ring oscillator circuit 209.

Furthermore, in some states, when the frequency of the output clock signal Out_Clk provided by the ring oscillator circuit 209 is a multiple of the frequency of the input reference clock signal Ref_Clk, only the PD 201 may not confirm whether the frequency of the output clock signal Out_Clk is reached to the locked frequency. Accordingly, in another exemplary embodiment of the present invention, the PLL 200 may further include a frequency detector 225. Two terminals of the frequency detector 225 are respectively coupled to the ring oscillator circuit 209 and the CP 203. To be specific, the frequency detector 225 may be coupled with the PD 201 in parallel, or may be coupled between the ring oscillator circuit 209 and the PD 201, or may be coupled between the PD 201 and the CP 203. The frequency detector 225 is used for detecting whether the output clock signal Out_Clk provided by the ring oscillator circuit 209 is reached to a locked frequency or not.

Figure 5:
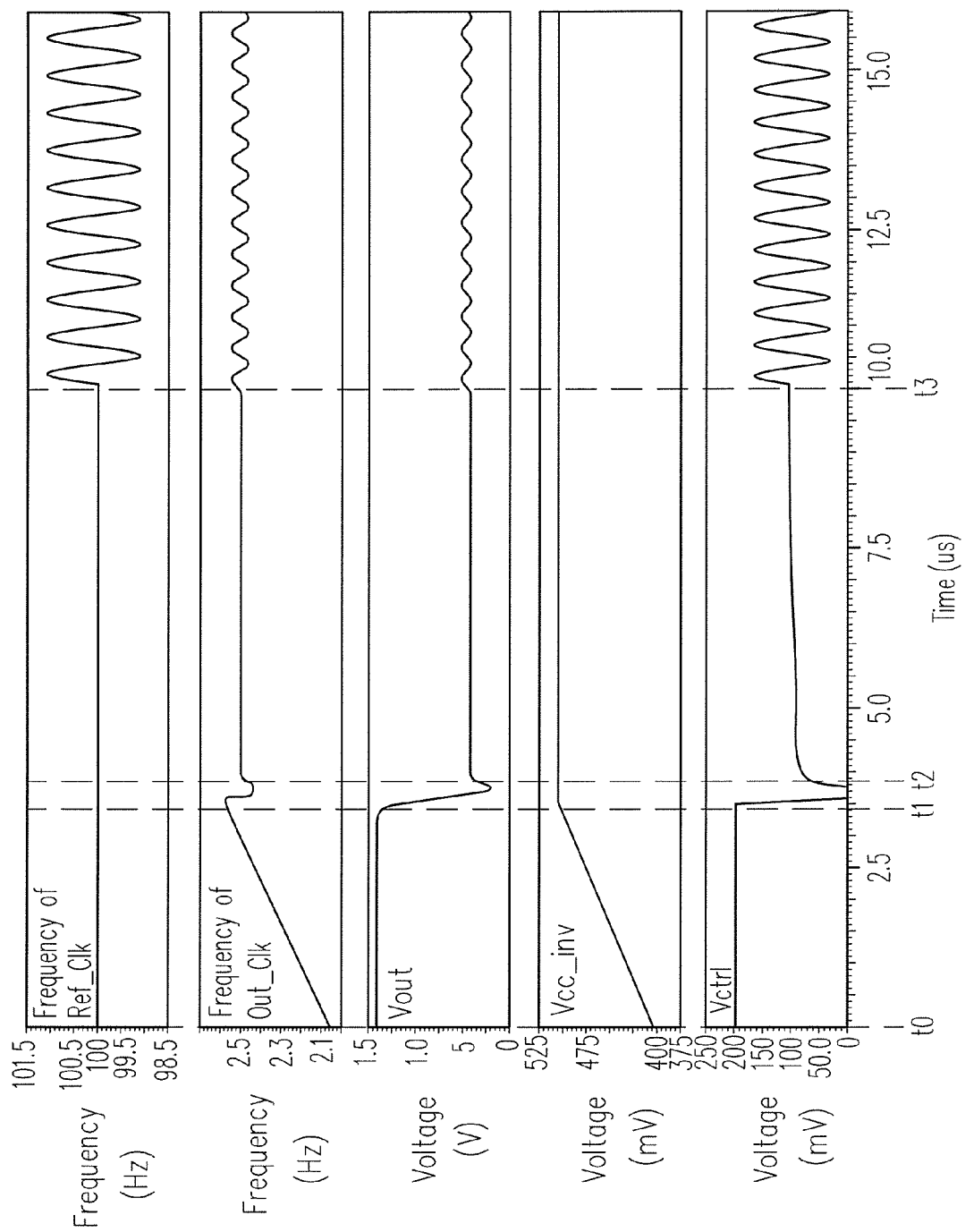
FIG. 5 is a simulation wave diagram of a PLL according to an exemplary embodiment of the present invention.

Referring to FIG. 5 which is a simulation wave diagram of the PLL 200 according to an exemplary embodiment, wherein the main setting conditions as below, but all not limited thereto:

The input reference clock signal Ref_Clk is 100 MHz;

The predetermined locked frequency of the VCO 207 is 2.5 GHz;

The divisor of the frequency divider 223 is 25;

The first voltage-frequency gain Kvco1 is 5 GHz/V;

The second voltage-frequency gain Kvco2 is 500 MHz/V; and

The best operating point A is 100 mV.

It can known that, in FIG. 5, the input reference clock signal Ref_Clk with 100 MHz is inputted at time t0, and at this time, the frequency of the output clock signal Out_Clk provided by the VCO 207 is near to 2.1 GHz. Since the frequency of the output clock signal Out_Clk is set to 2.5 GHz, so that the CP 203 would convert the output phase voltage of the PD 201 into a constant current, and charge the capacitor Cf of the next stage CF 205 by the constant current. Accordingly, the output voltage Vout provided by the CP 203 would rise and near to 1.25V. The operation voltage Vcc_inv on the output terminal of the driving circuit 219 starts rising from 400 mV. The dynamic loop operating voltage Vctrl is locked at 200 mV by the characteristic of the differential amplifier. And, at this time, the output clock signal Out_Clk provided by the ring oscillator circuit 209 is risen by following the rising track of the operation voltage Vcc_inv on the output terminal of the driving circuit 219. In other words, the output clock signal Out_Clk provided by the ring oscillator circuit 209 is mainly influenced by the first voltage-frequency gain Kvco1 at this time.

At the time t1, the frequency of the output clock signal Out_Clk provided by the VCO 207 has exceeded 2.5 GHz. Accordingly, the CP 203 would draw back some current and thus causing that the output voltage Vout provided by the CP 203 appears a negative swing amplitude during the times t1 to t2. Since the instant variation of the output voltage Vout is smaller than the time constant of the filtering circuit 215, such that it does not influence the operation voltage Vcc_inv on the output terminal of the driving circuit 219, but it would obviously response on the dynamic loop operating voltage Vctrl. The output clock signal Out_Clk provided by the ring oscillator circuit 209 also appears a negative swing amplitude because of the second voltage-frequency gain Kvco2. In other words, the output clock signal Out_Clk provided by the ring oscillator circuit 209 is mainly influenced by the second voltage-frequency gain Kvco2 at this time.

At the time t3, the frequency of the input reference clock signal Ref_Clk occurs jittering between +1% to −1%, accordingly, the output voltage Vout provided by the CP 203 would be changed as follow because of such variation on the input reference clock signal Ref_Clk. However, such instant and faster voltage variation also does not influence the operation voltage Vcc_inv on the output terminal of the driving circuit 219, but such instant and faster voltage variation also would obviously response on the dynamic loop operating voltage Vctrl. At this time, the output clock signal Out_Clk provided by the ring oscillator circuit 209 also appears the phenomenon of frequency jittering because of the second voltage-frequency gain Kvco2, such that the output clock signal Out_Clk provided by the ring oscillator circuit 209 is also mainly influenced by the second voltage-frequency gain Kvco2.

Since the product of the resistor Rv and the capacitor Cv represents a time constant which may cause that the lock time of the PLL 200 to be increased a lot. Accordingly, in another exemplary embodiment of the present invention, the control circuit 211 may further include a switch SW coupled with the resistor Rv in parallel. During the initial operation stage of the PLL 200, the switch SW may be turned on to accelerate the lock time of the PLL 200. To be specific, when the PLL 200 is in the initial operation stage, the switch SW may be turned on for a predetermined time (for example, 1 µS, but not limited thereto, and may be determined by the practical design requirements). Accordingly, the voltage (i.e. the operation voltage Vcc_inv of the inverters INV1 to INV3) outputted from the driving circuit 219 would fast follow the output voltage Vout provided by the CP 203 to near to a desired voltage which is locked by the PLL 200, and let the frequency of the output clock signal Out_Clk provided by the VCO 207 to near to a desired locked frequency.

At this time, since the voltage value of the dynamic loop operating voltage Vctrl outputted from the processing circuit 213 has a lower effect on the frequency of the output clock signal Out_Clk provided by the VCO 207, so that once the switch SW is turned off, the variation of the voltage outputted from the buffer Buf is very slowly (such voltage variation can be seen as non-change for a short time), and thus there is no more effect on the loop dynamic of the PLL 200.

On the other hands, when the voltage outputted from the driving circuit 219 would let the frequency of the output clock signal Out_Clk provided by the VCO 207 to be mostly locked, the dynamic loop operating voltage Vctrl outputted from the processing circuit 213 would then follow the variation of the output voltage Vout provided by the CP 203, and influence the loop dynamic of the PLL 200. However, regardless of the voltage outputted from the driving circuit 219 at this time, the processing circuit 213 would output the dynamic loop operating voltage Vctrl throughout, so as to make that the output clock signal Out_Clk relative to the dynamic loop operating voltage Vctrl has a lower variation.

Accordingly, since the gain of the VCO 207 and the loop bandwidth of the PLL 200 both are determined by the second voltage-frequency gain Kvco2. Therefore, the variation of the loop bandwidth of the PLL 200 is quite low and stable in which the gain Kvco2 has a lower variation, such that the PLL 200 can be applied in some PLL's applications which are requested that the loop bandwidth should have very low variation.

It should be noted that the above-mentioned exemplary embodiments all are explaining that the VCO 207 is applied in the PLL 200, but only for single viewing the VCO 207, the gain of the VCO 207 is mainly determined by the second voltage-frequency gain Kvco2 for a short time. The gain of the VCO 207 is mainly determined by the both of the first and the second voltage-frequency gains Kvco1 and Kvco2 for a long time, but since the first voltage-frequency gain Kvco1 is larger than the second voltage-frequency gain Kvco2, so that the gain of the VCO 207 can be seen as and near to the first voltage-frequency gain Kvco1 for a long time. In another view, since the input reference clock signal Ref_Clk is different from more than the locked frequency, such that the time for tracing frequency is longer. And, at this period, the gain of the VCO 207 is similar to the first voltage-frequency gain Kvco1. Besides, when the frequency of the output clock signal Out_Clk provided by the VCO 207 is mostly locked, and the locked frequency may occur jittering, the gain of the VCO 207 is mainly determined by the second voltage-frequency gain Kvco2 at this time.

In addition, even though all of the above-mentioned exemplary embodiments all are explaining that the VCO 207 is applied in the PLL 200, but the application of the VCO 207 of the present invention may not be limited thereto. That is, if any one application needs a stable loop bandwidth, the VCO 207 is suitable for such application, such as the clock data recovery (CDR) system structure.

In summary, the variation of the gain (Kvco) of the VCO, provided by the present invention and applied in the PLL, is mainly determined by the second voltage-frequency gain which has a lower variation and may be fixed in ideal. Accordingly, even though the VCO is composed by the ring oscillator circuit which is highly influenced by temperature, voltage, and process changing, the variation of the gain (Kvco) is quite low, such that the loop bandwidth of the PLL also has a lower variation and is stable.

In addition, since the VCO is composed by the ring oscillator circuit, so that not only the VCO may be used in the low cost process, but also the VCO may have at least some of the advantages as that simple circuit structure, low fabrication cost, and small layout area. Accordingly, the die designer would like to design such VCO into the die. However, the advantages aforementioned may not be required in all versions of the invention.

It will be apparent to those skills in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A voltage controlled oscillator (VCO), comprising:
a ring oscillator circuit, for providing an output clock signal; and
a control circuit, coupled to the ring oscillator circuit, for receiving an output voltage to respectively provide a first voltage-frequency gain and a second voltage-frequency gain so as to control a frequency of the output clock signal provided by the ring oscillator circuit, wherein the first voltage-frequency gain is larger than the second voltage-frequency gain,
wherein the control circuit comprises:
a filtering circuit, coupled to the ring oscillator circuit, for receiving the output voltage so as to provide the first voltage-frequency gain; and
a dynamic loop frequency adjusting circuit, respectively coupled to the ring oscillator circuit and the filtering circuit, for providing the second voltage-frequency gain, and the dynamic loop frequency adjusting circuit comprises:

a processing circuit, coupled to the filtering circuit, for outputting a dynamic loop operating voltage; and a capacitive adjusting circuit, respectively coupled to the processing circuit and the ring oscillator circuit, for receiving the dynamic loop operating voltage so as to change a capacitance thereof accordingly.

2. The VCO according to claim 1, further comprising:
a driving circuit, respectively coupled to the ring oscillator circuit and the filtering circuit, for driving the ring oscillator circuit.

3. The VCO according to claim 1, wherein the ring oscillator circuit comprises at least one inverter.

4. The VCO according to claim 1, wherein the ring oscillator circuit comprises:
a first inverter;
a second inverter having an input terminal coupled to an output terminal of the first inverter; and
a third inverter having an input terminal coupled to an output terminal of the second inverter and an output terminal coupled to an input terminal of the first inverter.

5. The VCO according to claim 1, wherein the filtering circuit comprises:
a resistor having a first terminal to receive the output voltage; and
a capacitor having a first terminal coupled to a second terminal of the resistor and a second terminal coupled to a reference voltage level.

6. The VCO according to claim 2, wherein the driving circuit comprises:
a buffer having an input terminal coupled to the second terminal of the resistor and an output terminal outputting a voltage to be served as an operation voltage of the ring oscillator circuit.

7. The VCO according to claim 4, wherein
the capacitive adjusting circuit comprising:
a first varactor having a control terminal to receive the dynamic loop operating voltage, a first terminal coupled to the output terminal of the first inverter, and a second terminal coupled to a reference voltage level;
a second varactor having a control terminal to receive the dynamic loop operating voltage, a first terminal coupled to the output terminal of the second inverter, and a second terminal coupled to the reference voltage level; and
a third varactor having a control terminal to receive the dynamic loop operating voltage, a first terminal coupled to the output terminal of the third inverter, and a second terminal coupled to the reference voltage level.

8. The VCO according to claim 5, wherein the control circuit further comprises:
a switch coupled with the resistor in parallel.

9. The VCO according to claim 2, wherein the first voltage-frequency gain is a ratio of a variation of the frequency of the output clock signal provided by the ring oscillator circuit to a variation of an output voltage of the driving circuit; and the second voltage-frequency gain is a ratio of the frequency of the output clock signal provided by the ring oscillator circuit to a variation of an output voltage of the processing circuit.

10. The VCO according to claim 2, wherein the filtering circuit provides a time constant, and when a variation rate of the output voltage, received by the control circuit, is smaller than the time constant, the second voltage-frequency gain has a larger impact on the frequency of the output clock signal provided by the ring oscillator circuit than the first voltage-frequency gain.

11. The VCO according to claim 1, wherein the capacitive adjusting circuit comprises at least one varactor having a control terminal to receive the dynamic loop operating voltage, a first terminal coupled to the ring oscillator circuit, and a second terminal coupled to a reference voltage level.

12. The VCO according to claim 1, wherein the processing circuit comprises a differential amplifier.

13. The VCO according to claim 5, wherein the processing circuit comprises a differential amplifier having a non-inverted terminal and an inverted terminal respectively coupled to the first and the second terminals of the resistor of the filtering circuit.

14. A phase locked loop (PLL), comprising:
a phase detector, for comparing a phase of an input reference clock signal with a phase of an output clock signal so as to output a control signal accordingly;
a charge pump, coupled to the phase detector, for generating an output voltage in response to the control signal;
a loop filter, coupled to the charge pump, for filtering high frequency noises on the output voltage; and
a voltage controlled oscillator (VCO), comprising:
a ring oscillator circuit, for providing an output clock signal; and
a control circuit, coupled to the ring oscillator circuit, for receiving an output voltage to respectively provide a first voltage-frequency gain and a second voltage-frequency gain so as to control a frequency of the output clock signal provided by the ring oscillator circuit, wherein the first voltage-frequency gain is larger than the second voltage-frequency gain,
wherein the control circuit comprises:
a filtering circuit, coupled to the ring oscillator circuit, for receiving the output voltage so as to provide the first voltage-frequency gain; and
a dynamic loop frequency adjusting circuit, respectively coupled to the ring oscillator circuit and the filtering circuit, for providing the second voltage-frequency gain, and the dynamic loop frequency adjusting circuit comprises:
a processing circuit, coupled to the filtering circuit, for outputting a dynamic loop operating voltage; and
a capacitive adjusting circuit, respectively coupled to the processing circuit and the ring oscillator circuit, for receiving the dynamic loop operating voltage so as to change a capacitance thereof accordingly.

15. The PLL according to claim 14, wherein the VCO further comprises:
a driving circuit, respectively coupled to the ring oscillator circuit and the filtering circuit, for driving the ring oscillator circuit.

16. The PLL according to claim 14, further comprising:
a frequency divider, coupled between the ring oscillator circuit and the phase detector, for down-converting a frequency of the output clock signal provided by the ring oscillator circuit.

17. The PLL according to claim 14, further comprising:
a frequency detector, coupled between the ring oscillator circuit and the charge pump, for detecting whether a frequency of the output clock signal provided by the ring oscillator circuit reaches a locked frequency or not.

* * * * *